United States Patent
Abel

(10) Patent No.: US 11,437,250 B2
(45) Date of Patent: Sep. 6, 2022

(54) PROCESSING SYSTEM AND PLATFORM FOR WET ATOMIC LAYER ETCHING USING SELF-LIMITING AND SOLUBILITY-LIMITED REACTIONS

(71) Applicant: Tokyo Electron Limited, Tokyo (JP)

(72) Inventor: Paul Abel, Austin, TX (US)

(73) Assignee: TOKYO ELECTRON LIMITED, Tokyo (JP)

( * ) Notice: Subject to any disclaimer, the term of this patent is extended or adjusted under 35 U.S.C. 154(b) by 314 days.

(21) Appl. No.: 16/402,611

(22) Filed: May 3, 2019

(65) Prior Publication Data
US 2020/0161148 A1  May 21, 2020

Related U.S. Application Data

(63) Continuation-in-part of application No. 16/287,658, filed on Feb. 27, 2019.

(60) Provisional application No. 62/767,808, filed on Nov. 15, 2018.

(51) Int. Cl.
| | |
|---|---|
| *H01L 21/67* | (2006.01) |
| *H01L 21/677* | (2006.01) |
| *C23C 22/83* | (2006.01) |
| *C23C 22/77* | (2006.01) |

(52) U.S. Cl.
CPC ........ *H01L 21/67075* (2013.01); *C23C 22/77* (2013.01); *C23C 22/83* (2013.01); *H01L 21/67069* (2013.01); *H01L 21/67703* (2013.01); *H01L 21/67739* (2013.01)

(58) Field of Classification Search
None
See application file for complete search history.

(56) References Cited

U.S. PATENT DOCUMENTS

| | | | | |
|---|---|---|---|---|
| 5,374,328 | A * | 12/1994 | Remba | H01L 29/66462 438/167 |
| 6,054,333 | A * | 4/2000 | Bensaoula | B24B 37/013 216/60 |
| 6,616,014 | B1 * | 9/2003 | Pozniak | B01F 15/0441 222/129.3 |
| 6,805,769 | B2 * | 10/2004 | Okuda | B08B 3/024 134/113 |

(Continued)

FOREIGN PATENT DOCUMENTS

KR   10-2017-0077839 A   7/2017

OTHER PUBLICATIONS

International Search Report issued in Application No. PCT/US2019/061683, dated Mar. 13, 2020 (9 pages).

*Primary Examiner* — Sylvia MacArthur
(74) *Attorney, Agent, or Firm* — Weihrouch IP

(57) ABSTRACT

A processing system and platform for improving both the microscopic and macroscopic uniformity of materials during etching is disclosed herein. These improvements may be accomplished through the formation and dissolution of thin, self-limiting layers on the material surface by the use of wet atomic layer etching (ALE) techniques. For etching of polycrystalline materials, these self-limiting reactions can be used to prevent this roughening of the surface during etching. Thus, as disclosed herein, a wet ALE process uses sequential, self-limiting reactions to first modify the surface layer of a material and then selectively remove the modified layer.

22 Claims, 7 Drawing Sheets

(56) References Cited

U.S. PATENT DOCUMENTS

| | | | | |
|---|---|---|---|---|
| 6,841,031 B2* | 1/2005 | Iwata | ............... | C03C 23/0085 |
| | | | | 156/345.22 |
| 6,896,600 B1* | 5/2005 | Wu | ............... | B24B 21/04 |
| | | | | 222/420 |
| 7,582,181 B2* | 9/2009 | Babic | ............... | B08B 7/0021 |
| | | | | 118/715 |
| 9,953,826 B2* | 4/2018 | Kaneko | ............ | H01L 21/67051 |
| 10,157,756 B2* | 12/2018 | Yamada | ............ | H01L 21/67086 |
| 10,784,175 B2* | 9/2020 | Clark | ............... | H01L 22/26 |
| 10,861,744 B2* | 12/2020 | Trickett | ............... | G05B 13/027 |
| 2006/0289389 A1 | 12/2006 | Shea | | |
| 2009/0007938 A1* | 1/2009 | Dubreuil | ............ | H01L 21/6708 |
| | | | | 134/10 |
| 2009/0047790 A1 | 2/2009 | Raghu et al. | | |
| 2010/0279435 A1* | 11/2010 | Xu | ............... | B24B 55/02 |
| | | | | 438/5 |
| 2012/0031768 A1* | 2/2012 | Reid | ............... | H01L 21/76898 |
| | | | | 205/123 |
| 2014/0199840 A1* | 7/2014 | Bajaj | ............... | B24B 37/11 |
| | | | | 438/692 |
| 2016/0089686 A1* | 3/2016 | Lee | ............... | H01L 21/6708 |
| | | | | 216/92 |
| 2016/0141210 A1 | 5/2016 | Let et al. | | |
| 2016/0372320 A1* | 12/2016 | Emoto | ............ | H01L 21/68728 |
| 2017/0356084 A1 | 12/2017 | Nakanishi et al. | | |
| 2018/0061675 A1* | 3/2018 | Kim | ............... | H01L 21/68735 |
| 2018/0090352 A1* | 3/2018 | Sotoku | ............ | H01L 21/67178 |
| 2019/0011734 A1* | 1/2019 | Otsuji | ............... | G02F 1/1333 |
| 2019/0027383 A1* | 1/2019 | Nakai | ............... | F26B 5/08 |
| 2019/0148192 A1* | 5/2019 | Yamaguchi | ....... | H01L 21/67023 |
| | | | | 438/5 |
| 2019/0295846 A1* | 9/2019 | Clark | ............... | H01L 21/3086 |
| 2020/0161148 A1* | 5/2020 | Abel | ............... | C23C 22/77 |

\* cited by examiner

PROCESSING SYSTEM AND PLATFORM FOR WET ATOMIC LAYER ETCHING USING SELF-LIMITING AND SOLUBILITY-LIMITED REACTIONS

This application is a continuation-in-part application of U.S. patent application Ser. No. 16/287,658, filed Feb. 27, 2019 and entitled "Wet Atomic Layer Etching Using Self-Limiting and Solubility-Limited," which is hereby incorporated by reference in its entirety. This application also claims priority to U.S. Provisional Patent Application No. 62/767,808, entitled, "Wet Atomic Layer Etching Using Self-Limiting and Solubility-Limited Reactions" filed Nov. 15, 2018; the disclosure of which is expressly incorporated herein, in its entirety, by reference.

BACKGROUND

The present disclosure relates to the processing of substrates. In particular, it provides a method of etching of layers on substrates.

During substrate processing, a variety of techniques are known for etching various layers on a substrate. Plasma etching and wet etching are two well-known techniques. Wet etching involves dispensing a chemical solution over the surface of a substrate or immersing the substrate in the chemical solution. Often, the chemical solution contains a solvent, chemicals designed to react with materials on the substrate surface, and chemicals to promote dissolution of the reaction products. The result of exposure of the substrate surface to the etchant is the removal of material from the substrate. Etchant composition and temperature may control the etch rate, specificity, and residual material on the surface of the substrate post etch.

Thermodynamics and kinetics both play roles in etchant formulation. The desired reactions need to be both thermodynamically and kinetically favorable for a successful etch. The requirements for success become much more stringent for etching polycrystalline materials. For these materials, it is desirable that the removal rates for each individual crystallite facet and grain boundary geometry is substantially similar regardless or crystallite morphology or environment. Surface roughness plays an important role in interface quality and electrical properties of nanoscale features. When etching nanoscale polycrystalline materials, differing etch rates at grain boundaries compared to the different crystal facets leads to roughening of the surface during etching. Further, it is desirable that the material removal rate should be uniform at the macroscopic and microscopic levels and occurs at a rate that is compatible with high volume manufacturing. Macroscopic uniformity can be addressed with careful engineering, but microscopic uniformity depends on the chemistry of the etch itself.

As geometries of substrate structures continue to shrink and the types of structures evolve, the challenges of etching substrates have increased. One technique that has been utilized to address these challenges is atomic layer etching (ALE). ALE processes are generally known to involve processes which remove thin layers sequentially through one or more self-limiting reactions. For example, ALE typically refers to techniques that can etch with atomic precision—remove material one or a few monolayers at a time. In general, ALE schemes rely on a chemical modification of the surface to be etched followed by the selective removal of the modified layer. Thus, ALE processes offer improved performance by decoupling the etch process into sequential steps of surface modification and removal of the modified surface. Such processes often include multiple cyclic series of layer modification and etch steps. The modification step may modify the exposed surfaces and the etch step may selectively remove the modified layer. Thus, in one embodiment a series of self-limiting reactions may occur and the cycle may be repeatedly performed. In other embodiments, the process may use just one cycle. As used herein, an ALE process may also include quasi-ALE processes. In such processes, a series of modification and etch step cycles may still be used. However, the removal step may not be purely self-limiting as after removal of the modified layer, the etch substantially slows down, though it may not completely stop. Known ALE techniques have thus far been accomplished in vacuum, or in the gas phase. Such techniques utilize plasma or high-temperature thermochemical reactions to modify the material surface followed by chemical or ligand exchange reaction to volatilize the modified layer. The nature of ALE leads to smoothing of the surface as it is etched.

Other known sequential etching techniques includes etching of III-V semiconductors using an oxygen plasma, ozone, or hydrogen peroxide as a self-limiting oxidation step and an acid wet etch to selectively remove the oxide. However, while the prior art provides a sequential etch process, it lacks atomic layer control due to the aggressive oxidants required.

Meeting microscopic and macroscopic etch uniformity requirements to an acceptable degree with known etch techniques has become increasingly difficult as the size of features being etched continues to decrease. Thus, it would be desirable to provide an improved etching process.

SUMMARY

A method for improving both the microscopic and macroscopic uniformity of materials during etching is disclosed herein. These improvements may be accomplished through the formation and dissolution of thin, self-limiting layers on the material surface by the use of wet ALE techniques. For etching of polycrystalline materials, these self-limiting reactions can be used to prevent this roughening of the surface during etching. Thus, as disclosed herein, a wet ALE process uses sequential, self-limiting reactions to first modify the surface layer of a material and then selectively remove the modified layer. In another embodiment, a platform for accomplishing the disclosed methods is disclosed. The platform may include a wet chemical supply system arranged to supply the chemical solutions of the wet ALE process. Further, the platform may include both a wet etching tool and a dry etching tool in which substrates may move from the dry etching tool to the wet etching tool having environmentally separated chambers. In one embodiment, the substrate may be processed within the dry and wet etching tools without exposure to the ambient atmosphere.

In one embodiment, a method of etching a substrate is provided. The method may comprise receiving the substrate, the substrate having a first material exposed, the first material comprising a polycrystalline material. The method further comprises selectively etching the polycrystalline material, the selectively etching including chemical modification of a surface of the polycrystalline material by exposing the surface to a chemical solution to provide a modified surface layer, and selective removal of the modified surface layer of the polycrystalline material by exposing the modified surface layer to a liquid-phase chemical solution.

In one embodiment, the chemical modification of the surface of the polycrystalline material includes oxidation of the polycrystalline material using an oxidizing agent. In one embodiment, the oxidizing agent includes an oxygen-containing gaseous environment, a chemical solution containing dissolved oxygen or other oxidizing agent, or a solvent—such as water—that directly participates in the oxidation of the surface. In another embodiment, the oxidizing agent is an oxygen-saturated chemical solution that includes oxygen dissolved in water, alcohol, or acetone.

In another embodiment, the chemical modification further includes passivation of the modified layer of the polycrystalline material using a complexing agent. In one embodiment, the complexing agent includes a citrate.

In another embodiment, the chemical modification further includes passivation of the modified layer in the polycrystalline material by exposing the substrate to citric acid. In another embodiment, the chemical modification includes exposing the substrate to molecular oxygen and a citrate.

In another embodiment, the method of etching the substrate described above further comprises rinsing the substrate with a solvent following the chemical modification, and preceding the selective removal.

In another embodiment of the methods of etching the substrate described above, the selective removal includes exposing the modified layer of the polycrystalline material to an aqueous solution to dissolve the modified layer.

In other embodiments, the methods of etching the substrate described are utilized wherein the chemical modification and the selective removal are sequentially and alternatingly performed. In some embodiments, the sequential steps of the chemical modification and the selective removal are (1) partially overlapped in time or (2) continuously performed. In some embodiments, the sequential steps of the chemical modification and the selective removal are not overlapped in time.

In yet further embodiments, prior to performing the selective etching described above, selectively dry etching the polycrystalline material by exposing the polycrystalline material to a gas-phase environment may be performed.

In one embodiment, the polycrystalline material may be a transition metal or may be a noble metal. In one preferred embodiment, the polycrystalline material is either ruthenium or cobalt.

In another embodiment, a method of etching a substrate is described. The method may comprise receiving the substrate with a first material composed of a polycrystalline material, and a second material composed of a different material, wherein an exposed surface of the polycrystalline material has a surface roughness characterized by a first surface roughness value. The method further comprises reducing the surface roughness to a second surface roughness value by exposing the substrate to a first wet chemical solution to chemically modify the polycrystalline material to create a chemically modified layer, followed by exposing the substrate to a second wet chemical solution to dissolve the chemically modified layer. In one embodiment, the polycrystalline material is a transition metal. In another embodiment, the chemical modification of the polycrystalline material includes oxidation of the polycrystalline material using an oxidizing agent. In yet another embodiment, the method further comprises etching the polycrystalline material on the substrate using a dry etching process, wherein the first surface roughness value is an outcome of the dry etching process.

In yet another embodiment, a processing system to perform a wet etch process on a substrate, is disclosed. The system comprises a wet process chamber configured to perform a wet chemical process; and a substrate holder within the wet process chamber, and configured to support a substrate. The system further comprises a chemical supply system arranged to supply a first chemical solution and a second chemical solution onto the substrate within the wet process chamber, the second chemical solution being different than the first chemical solution, wherein the first chemical solution is selected to chemically modify a surface of the substrate to create a chemically modified layer and wherein the second chemical solution is selected to remove the chemically modified layer. The system also comprises a chemical injection manifold fluidically coupled to the wet process chamber, and configured to cyclically dispense the first chemical solution and the second chemical solutions. The system further comprises controller programmably configured to control the time duration for each dispense cycle of the first chemical solution and the second chemical solution.

In one embodiment of the system described above, the system is arranged wherein the first chemical solution comprises an oxidizing agent. In another embodiment the first chemical solution comprises an oxygen-saturated chemical solution. In yet another embodiment, the first chemical solution comprises an oxygen-saturated chemical solution that includes oxygen dissolved in water, alcohol, or acetone. The system may further be configured wherein the chemical supply system is further arranged to supply a complexing agent. In one embodiment, the complexing agent includes a citrate.

In yet another embodiment of the system described above, the chemical supply system is further arranged to supply a solvent rinse solution. In one embodiment, the controller is programmably configured to provide the solvent rinse solution following the chemical modification and preceding the selective removal.

In another embodiment of the system described above, the controller is programmably configured to provide the cyclically dispense of the first chemical solution and the second chemical solution partially overlapping in time. In another embodiment, the controller is programmably configured to provide the cyclically dispense of the first chemical solution and the second chemical solution in a manner not overlapping in time.

In still another embodiment of the system described above, the first chemical solution includes a complexing agent and the second chemical solution comprises water.

In yet another embodiment, a platform for etching a substrate having polycrystalline material, is disclosed. The platform may comprise a dry etching tool for etching the polycrystalline material, and a wet etching tool for etching the polycrystalline material, wherein the wet etching tool is arranged to supply a first chemical solution and a second chemical solution onto the substrate within the wet process chamber, the second chemical solution being different than the first chemical solution, wherein the first chemical solution is selected to chemically modify a surface of the substrate to create a chemically modified layer and wherein the second chemical solution is selected to remove the chemically modified layer. The platform further comprises a transfer module for moving the substrate between the dry etching tool and the wet etching tool. The platform also comprises an isolation pass-through module disposed between the transfer module and the wet etching tool to separate an transfer module environment of the transfer module from a wet etch tool environment of the wet etching tool.

In another embodiment of the platform described above, the dry etching tool is configured to first etch the polycrystalline material to a first surface roughness value and the wet etching tool is configured to subsequently etch the polycrystalline material to a second surface roughness value, second surface roughness value being less than the first surface roughness value. In still another embodiment, the platform is configured to maintain the substrate in a controlled environment without exposure to ambient conditions when the substrate is transferred from the dry etch tool to the wet etch tool. In yet another embodiment, the first chemical solution comprises an oxidizing agent. In still another embodiment, the wet etch tool is further arranged to supply a solvent rinse solution. In another embodiment, the wet etch tool is configured to provide the solvent rinse following the chemical modification, and preceding the selective removal.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Figure 1A:
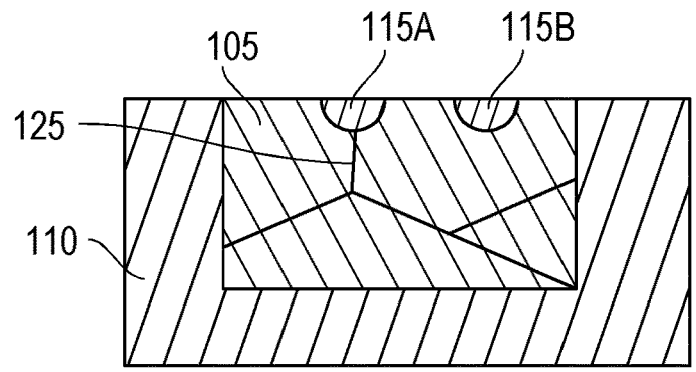
FIGS. 1A-1C illustrate illustrates a kinetic analysis of a polycrystalline metal etch.

A method for improving both the microscopic and macroscopic uniformity of materials during etching is disclosed herein. These improvements may be accomplished through the formation and dissolution of thin, self-limiting layers on the material surface by the use of wet ALE techniques. For etching of polycrystalline materials, these self-limiting reactions can be used to prevent this roughening of the surface during etching. Thus, as disclosed herein, a wet ALE process uses sequential, self-limiting reactions to first modify the surface layer of a material and then selectively remove the modified layer. In another embodiment, a platform for accomplishing the disclosed methods is disclosed. The platform may include a wet chemical supply system arranged to supply the chemical solutions of the wet ALE process. Further, the platform may include both a wet etching tool and a dry etching tool in which substrates may move from the dry etching tool to the wet etching tool having environmentally separated chambers. In one embodiment, the substrate may be processed within the dry and wet etching tools without exposure to the ambient atmosphere.

As described herein, methods for implementing sequential, self-limiting reactions using wet chemical methods are provided. Using the wet ALE processes of the methods, surface reactions in the etch solutions are self-limiting, so the total etched amount may be integer multiples of the etch amount per cycle. For this reason, the method can also be referred to as a "digital etch." The techniques described herein may be utilized for a wide variety of materials that are known in the substrate processing art. Such materials may include polycrystalline materials. In one embodiment, the polycrystalline may be a metal. In some embodiments, the metal may be a transition metal. In other embodiments, the metal is a noble material. In some specific embodiments, the metal may be comprised of ruthenium (Ru) or cobalt (Co).

In one embodiment, the wet etch technique described consists of sequentially exposing the substrate surface to two or more etchant solutions. The first etchant reacts with the surface of the substrate in a self-limiting fashion. The second etchant dissolves reaction products and exposes a fresh surface that is free to react with the first etchant in subsequent cycles. In contrast to dry ALE, which is a dry process relying on the volatility of reaction products, this wet etch ALE relies on the solubility of the reaction products for their removal. In order to be self-limiting, it is desirable for the surface reaction products to generally be insoluble in the first etchant. The reaction products are, however, readily soluble in the second etchant for material to be removed in the digital etch.

Additionally, the substrate surface to be removed reacts readily, and in a self-limiting fashion, with components of the first etchant, but does not react with the second etchant. The difference in substrate reactivity and product solubility can be accomplished with different chemical additives in a common solvent or with different solvents used for each of the two etchants.

The method described provides atomic layer control. The method can be generalized to any type of material to be etched using wet chemistries. The method can expand the role of solvent choice in passivation layer solubility. Further, complexing agents may be used as a method for controlling the solubility of reaction products.

The techniques described herein offer the opportunity of multiple advantages over other etch approaches. The techniques provide the benefits of ALE such as precise control of total etch amount, control of surface roughness, and improvements in wafer-scale uniformity. The techniques also provide several benefits of wet etching such as the simplicity of the etch chamber, atmospheric etching conditions, and speed at which it can be accomplished.

Wet ALE is accomplished by sequential exposure of a substrate surface to multiple etch etchants. Each etchant often comprises a solvent that may contain one or more of the following: chemical(s) that react with the substrate surface, chemical(s) that react with products formed on the substrate surface, chemical(s) that promote the dissolution of products formed on the substrate surface, or chemical(s) that promote cleaning of the substrate surface. The substrate may be rinsed with an inert solution between exposures to sequential etchants to prevent cross-contaminations of etchants. The substrate may also be exposed to gas-phase reactants between etchant exposures in order to drive additional chemistry.

An etchant in a wet ALE process will generally react with the substrate surface in a self-limited fashion. The etchant may react with the substrate surface to form a chemically modified layer on the substrate surface, it may react with the modified layer, it may dissolve the modified layer, or it may do some combination of these processes. Generally it is desirable that the etchant is selective and self-limiting. It is also desirable that the substrate surface can be affected by the etchant while underlying layers remain unchanged. The thickness of the self-limiting reaction is generally on the atomic scale. One monolayer is ideal though not required.

Exposure to a single etchant can be accomplished by a wide range of techniques, including by dipping the substrate in a bath, exposing the substrate to an aerosol spray, or dispensing the etchant onto the substrate in a spin chamber. In each case, it is preferably that the dose of etchant is sufficient to drive the reaction to its self-limiting value across the entire substrate surface.

The substrates utilized with the techniques disclosed herein may be any substrates for which the etching of material is desirable. For example, in one embodiment, the substrate may be a semiconductor substrate having one or more semiconductor processing layers (all of which together may comprise the substrate) formed thereon. In one embodiment, the substrate may be a substrate that has been subject to multiple semiconductor processing steps which yield a wide variety of structures and layers, all of which are known in the substrate processing art. In one embodiment, the substrate may be a semiconductor wafer including the various structures and layers formed.

As mentioned above, the techniques described herein may be used to etch a wide variety of materials. Such materials may include polycrystalline materials. Such materials may include metal, including but not limited to transition metals and noble metals. In one exemplary embodiment, the material to be etched may be a polycrystalline cobalt material. As provided below, the techniques described herein are described with relation to an etch of a polycrystalline cobalt material. However, it will be recognized by those skilled in the art that such an example is merely exemplary and other materials may be used.

Figure 1B:
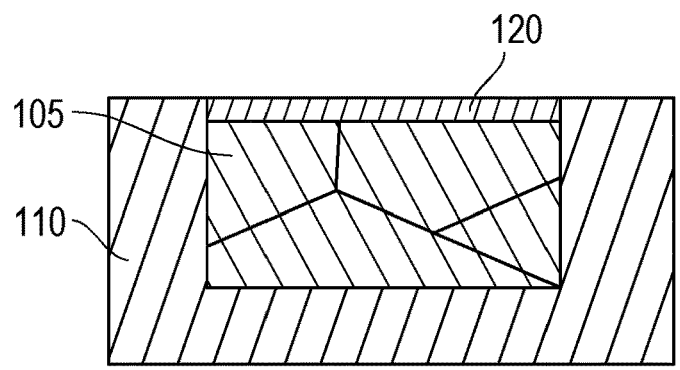
Figure 1C:
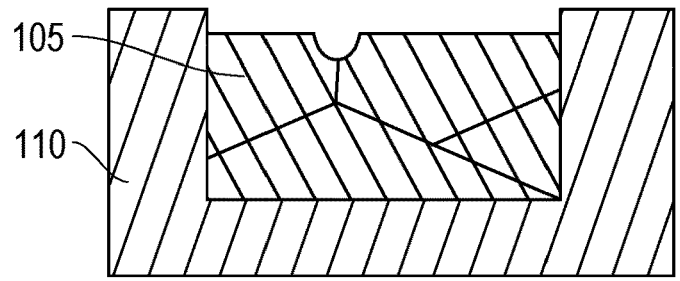

Many chemicals can etch polycrystalline cobalt, but controlling surface roughness during etching is difficult. Pitting and preferential etching at grain boundaries is difficult to prevent. Because zero valent cobalt is generally insoluble, it must first be oxidized. As used herein, oxidation of the cobalt refers to increasing formal charge of the cobalt. The oxidized species is then able to be dissolved into solution. Kinetic analysis of the generic two-step etch process (oxidation followed by dissolution) shows three relevant reaction rates: $K_{ox,b}$, the oxidation rate at grain boundaries, $K_{ox,b}$, the oxidation rate at grain surfaces, and $K_d$, the oxide dissolution rate. The relative speeds of these reactions determines the post etch roughness. These reactions are presented in FIGS. 1A-1C which illustrates a kinetic analysis of a polycrystalline metal etch. As shown in FIGS. 1A-1C, a polycrystalline metal (to be etched), for example, cobalt 105 is surrounded a dielectric 110 and oxidized metal regions 115A, 115B and 120 are formed on the top of the cobalt 105. As shown in FIG. 1A, oxidized metal region 115A is formed at a grain boundary 125 of the cobalt 105. An oxidized metal region 115B is formed on the grain surface. Equations 1 and 2 show the oxidation equations for oxidation at the grain boundary and grain surface respectively.

$$Co_{(grain)} + oxidizer \xrightarrow{k_{ox,g}} CoO \quad \text{Eq. 1}$$

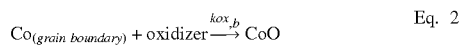

$$Co_{(grain\ boundary)} + oxidizer \xrightarrow{k_{ox,b}} CoO \quad \text{Eq. 2}$$

Equation 3 shows an exemplary dissolution reaction of the cobalt oxide when utilizing citric acid in the reaction.

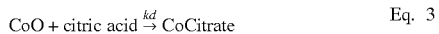

$$CoO + citric\ acid \xrightarrow{k_d} CoCitrate \quad \text{Eq. 3}$$

If the $K_{ox,b}$, (the oxidation rate at grain boundaries) is greater than $K_{ox,g}$, (the oxidation rate at grain surfaces), then preferential oxidation may occur at grain boundaries. If the oxidation reaction rates ($K_{ox}$) are much greater than the dissolution reaction rate ($K_d$) than surface roughness increases may not occur such as shown in FIG. 1B (FIG. 1B illustrating the structure with oxidized metal region 120 being cobalt oxide on the structure surface). If the oxidation reaction rates ($K_{ox}$) are less than or equal to the dissolution reaction rate ($K_d$), than surface roughness may increase such as shown in FIG. 1C. In the equations above, the native oxide layer is presented as a cobalt oxide. However, the native oxide formed may be composed of cobalt oxides, cobalt hydroxides, cobalt oxyhydroxides or some combination of these species.

Specifically, if oxidation is faster than dissolution, then the surface presented to the etch solution will be oxidized metal. The oxidized layer will continue to grow in thickness unless it is self-limited. If it is self-limited, then an oxidized layer of limited thickness will propagate down through the cobalt as the metal is etched. In this case, smooth etching will result because the oxidation rates at the grain boundaries and grain surfaces are not important—dissolution is the rate-determining step. If, however, dissolution is faster than oxidation, a metallic surface will be in contact with the etch solution because oxidized cobalt is dissolved into solution as fast as it is formed. This is the situation where the etch rate is controlled by oxidation kinetics, so faster oxidation rates at the grain boundaries lead to faster etching at the grain boundaries, pitting, and surface roughness increases.

As described below, the following is a method for temporally separating the oxidation and dissolution steps of the etch process. Each reaction is carried out in its own etch solution. The oxidation step is self-limiting, and the dissolution step is selective to remove only the oxidized metal. If these conditions are generally met, the total etch amount will be an integer multiple of the self-limiting oxide thickness. Such a process will provide a wet ALE process that leads to decreasing surface roughness as the etch progresses.

In order to provide an oxidation rate that is much faster than the dissolution rate, the oxidation step may be carried out with a solvent in which the oxidation products are insoluble. This allows the formation of a self-limiting oxidized layer without any material lost to dissolution. The oxidized surface can then be exposed to an etchant that will dissolve the oxidized layer without further oxidizing the surface. Complexing agents can be used to promote the solubility of the oxidized metal species. If these complexing agents are present in the oxidizing etchant, then a self-limiting metal complex is formed. If the etchant used for dissolution can dissolve the complex but not the oxidized metal, than the etchant can also be oxidizing, as the dissolution will still be self-limiting. There is also the possibility of complexing and dissolving with multiple etchants. For example, etchant 1 forms complex 1 on the surface. Etchant 2 dissolves complex 1 and forms complex 2 on the surface. Etchant 1 then dissolves complex 2 and continues the cycle by again forming complex 1. Such a technique may advantageously increase the etch rate per cycle.

For etching cobalt, in one embodiment, oxygen is used as the oxidizing agent and the complexing agent includes a citrate. In one embodiment, the oxidizing agent includes an oxygen contain gaseous environment or an oxygen saturated chemical solution. Exemplary oxygen saturated chemical solutions include, but are not limited to, oxygen dissolved in water, alcohol or acetone. In one embodiment, citric acid is used as the complexing agent. Citric acid reacts with cobalt oxide to form a species that is soluble in aqueous solution. The reaction between citric acid and cobalt oxide is also self-limiting. A single monolayer of product is formed when a cobalt oxide surface is exposed to citric acid. Citric acid will not react with metallic cobalt. Exposure to air or dissolved oxygen in solution forms a self-limiting native oxide layer on cobalt. The native oxide layer may be composed of cobalt oxides, cobalt hydroxides, cobalt oxyhydroxides or some combination of these species. This accomplishes the oxidation portion of the wet ALE. Non-aqueous solvents such as acetone or isopropyl alcohol can be used for the complexation step. Cobalt citrate is insoluble in these solvents, so a monolayer of cobalt citrate is formed as a self-limiting passivation layer. A non-aqueous solution of citric acid can be used as an etch bath or be dispensed over the substrate surface in a spin chamber. During this step, a self-limiting cobalt citrate layer is formed. This reaction is fast and self-limiting. The oxidation and complexation step can be accomplished in the same solution if the solution contains both dissolved oxygen and citric acid. The etchant may contain both of these components because both reactions are self-limiting and there is no reaction between molecular oxygen and citric acid in solution.

Following the complexation step, a solvent rinse may be performed to remove excess citric acid solution without disturbing the self-limited cobalt complex. This rinse can be accomplished in a solvent bath or by dispensing the solvent over the substrate in a spin chamber. The solvent used for the complexation step can be used for the rinse step, but any solvent where the complexing agent is soluble but the metal complex is not soluble can be used. This rinse step prevents mixing of the oxidizing/complexing solution and the dissolution solution. A mix of these solutions can spontaneously etch cobalt. Forgoing the rinse step may allow spontaneous etching of cobalt and prevents many of the benefits of the digital etch.

Following complexation and solvent rinsing, aqueous solution is used to remove the cobalt citrate layer. Either the substrate can be immersed in a water bath, or water can be dispensed over the substrate surface in a spin chamber. Cobalt citrate is readily soluble in aqueous solution; however, cobalt oxide and metallic cobalt are not. This process is shown in the four steps of FIGS. 2A-2D which show one etch cycle.

Figure 2A:
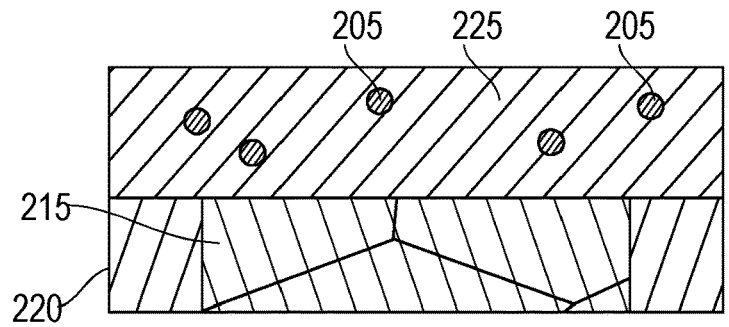
FIG. 2A-2D illustrate an exemplary etch cycle of an exemplary wet ALE metal etch.
Figure 2B:
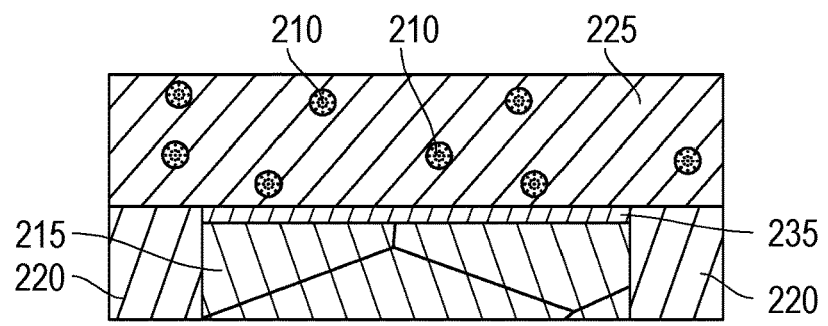
Figure 2C:
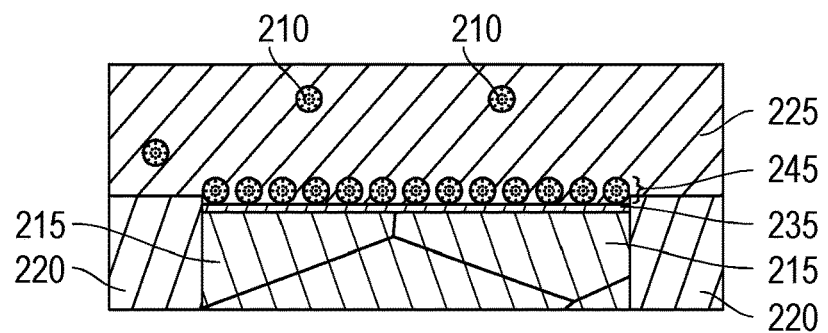
Figure 2D:
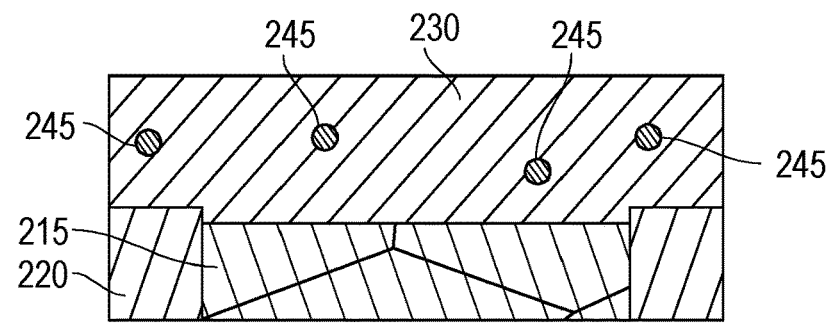

As shown in FIG. 2A, the first step of the etch cycle involves oxidizing the surface of the cobalt 215. As shown in FIG. 2A, cobalt 215 is embedded in a dielectric 220. The oxidation of the surface of the cobalt 215 may be accomplished by exposing the surface of cobalt 215 to atmosphere, an oxygen environment, or an oxygen-saturated solution of water, alcohol, acetone, or other solution. As shown in FIG. 2A, the cobalt 215 is exposed to oxygen 205 in acetone/isopropyl alcohol 225. As a result, a self-limiting cobalt oxide layer 235 is formed above cobalt 215 as shown in FIG. 2B. Then, the surface is then exposed to a non-aqueous citric acid solution as indicated by citrate 210 in FIG. 2B by citric acid being dissolved in either the acetone or isopropyl alcohol. A self-limiting cobalt-citrate complex 245 layer is formed on exposure to the cobalt oxide layer 235 as shown in FIG. 2C in which a portion of the cobalt oxide layer 235 has been consumed. Eventually, over one or more cycles that of complexing will consume the cobalt oxide layer 235. The self-limiting cobalt-citrate complex 245 layer is then removed by the water 230 of a water rinse as indicated by the cobalt-citrate complex 245 being removed into the solution as shown in FIG. 2D. It will be noted that the self-limiting rates of the oxide consumption/cobalt-citrate complex formation and the removal of the cobalt-citrate complex need not be the same. A solvent rinse may be required between the steps of FIGS. 2C and 2D to prevent spontaneous etching if the two etch solutions mix. Further, various steps may be combined by oxygenating the solutions used in those steps, however generally the surface must be rinsed between the steps of FIG. 2D and FIG. 2B to prevent spontaneous etching that occurs when those solutions mix.

It will be recognized that the particular oxidizing, complexing and dissolution solutions are described above are merely exemplary. Thus a wide range of solutions may be utilized, as may be appropriate for the particular material being etched and the concepts described herein are not limited to the particular oxidizing, complexing and dissolution solutions are described. For example, oxidizers such as oxygen, ozone, water, nitrous oxide, or hydrogen peroxide, complexing agents such as citrate, acetate, carboxylate containing species, or amine containing species, and dissolution solutions such as Acetonitrile may be utilized.

Figure 3:
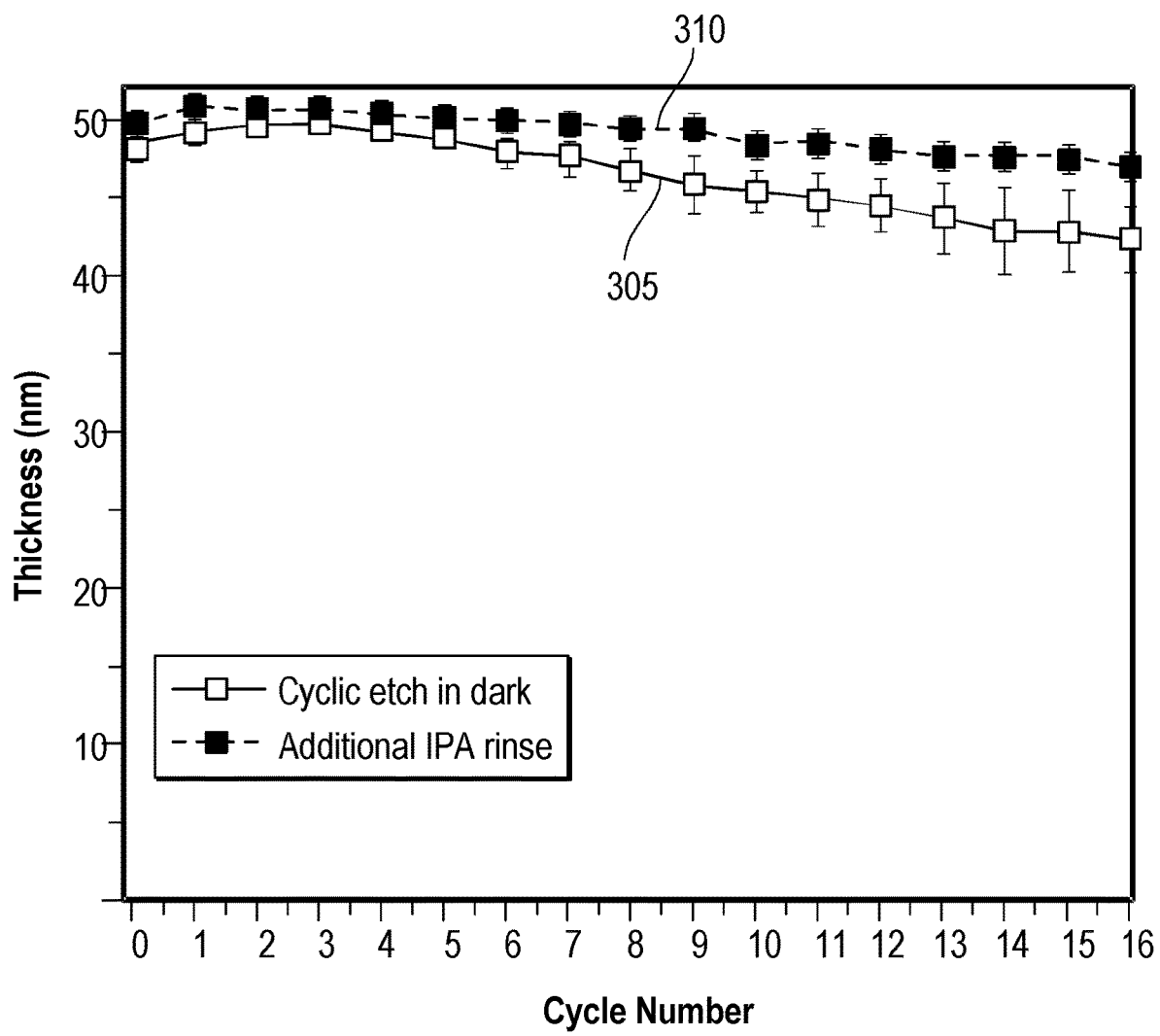
FIG. 3 illustrates the impact of a solvent rinse during an etch cycle such as shown in FIGS. 2A-2D.

The etch behavior of cobalt with and without the solvent rinse is shown in FIG. 3 which graphs thickness versus etch cycle numbers. Specifically, FIG. 3 illustrates the etch amount per cycle over multiple cycles of the process. With the solvent rinse, approximately 0.28 nm of cobalt is removed per etch cycle as shown by plot 310. This amount of etching is close to a single monolayer of cobalt. More than twice as much material, 0.6 nm of cobalt, is removed per etch cycle without the rinse step as shown in plot 305, indicating that spontaneous etching is occurring due to mixing of the etch solutions.

The self-limiting oxide thickness can be changed based on the solvent and oxidizer used. The self-limiting thickness of the metal complex layer can be changed by using different complexing agents. For molecular oxygen and citric acid, about 0.28 nm of cobalt is removed per etch cycle. Stronger oxidizers do not increase the amount of cobalt removed per etch cycle which suggests that the thickness of the cobalt citrate layer determines the etch rate per cycle.

There are multiple ways to structure the sequential etchant exposures to accomplish the same etch chemistry. An etchant containing dissolved oxygen or some other oxidizer and citric acid can be used to form a self-limiting cobalt citrate layer. Sequential exposure to an oxidizing etchant, either in solution or in the gas phase, followed by exposure to a citric acid containing etchant can be used instead. In both of these cases, the cobalt citrate layer is removed by a subsequent aqueous rinse. A third technique is to include the oxidizer in the aqueous rinse. The rinse removes the self-limited cobalt citrate layer as well as forms a self-limiting cobalt oxide layer. Subsequent exposure to a non-aqueous citric acid solution re-forms the self-limiting cobalt citrate layer for the next etch cycle.

Figure 4:
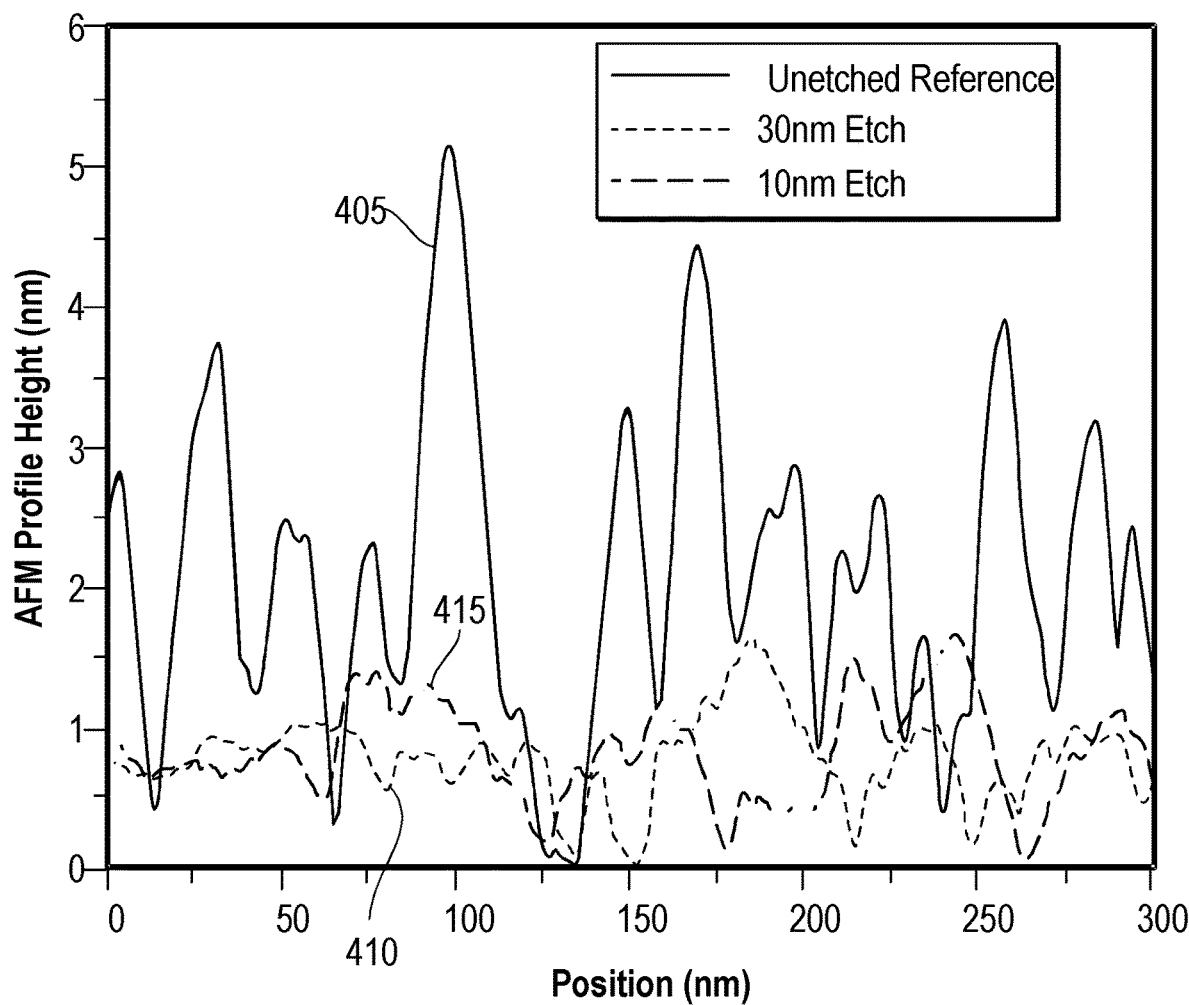
FIG. 4 illustrates the peak-to-peak roughness reduction which may occur in a wet ALE metal etch process.

The use of the disclosed etch chemistry decreases the surface roughness of cobalt films during etching. In one embodiment, the root mean square (RMS) roughness, as received, of the cobalt films was an RMS roughness of ~1.5 nm. This is reduced to ~0.6 nm after 10 nm of cobalt had been etched. This level of roughness is maintained for additional etching. The RMS roughness remains at ~0.6 nm after 30 nm of cobalt has been removed. The peak-to-peak roughness is also reduced as shown in FIG. 4 which graphs a profile height versus a substrate position. More specifically, FIG. 4 illustrates this peak-to-peak roughness of cobalt films after different amounts of wet ALE. The initial roughness of an unetched reference is shown as plot 405. This initial roughness of >5 nm is reduced to ~1.5 nm after only 10 nm of cobalt has been removed as shown by plot 415.

This improvement is maintained for additional etching, as shown by plot 410 which illustrates 30 nm of cobalt etch.

Cobalt wet ALE can be carried out in a spin chamber where the substrate is rotated while etch solution is dispensed onto the substrate surface. The motion of the substrate distributes the etchant evenly over the substrate surface. The dispense time for each etchant must be long enough so that the self-limiting reaction thickness is achieved over the entire substrate surface. The chemical being dispensed can be switched between etch components to accomplish the digital etching. A rinse solution may be dispensed in between the complexation and dissolution solutions to prevent spontaneous etching of the cobalt during the transient mixing of the solutions in the transition between them. A single etch cycle, defined by oxidation/complexation followed by dissolution of the complex, can be repeated until an appropriate amount of material is removed.

It will be recognized, that the use of a spin chamber is merely one embodiment and a wide variety of differing process tools may be used to perform the techniques described herein. As an alternative, for example, the substrate could be dipped in chemical baths containing the etchants. The substrate can be sequentially immersed in a baths of each etchant in order with intermediate rinse baths to prevent cross contamination of the chemicals. This process can be repeated until an appropriate amount of material is removed. In yet another embodiment, the process may be utilized with aerosol sprays, fogs or mists of each reactant. Further, it will be recognized that a combination of the various described tools for applying the reactants may be used, even within one cycle of the process.

Thus, as described herein, techniques are provided for etching layers in which self-limiting processes are utilized to provide smooth layers. One application of such a technique may be for etching metal surfaces for a recess etch for fully self-aligned vias. In such applications, metal-filled trenches in a dielectric material must be selectively etched without increasing the surface roughness of the metal. It will be recognized that such an application is merely exemplary and the techniques described herein may be used for many other applications.

In one embodiment, the wet etching techniques described herein may also be combined with dry etching techniques, such as plasma etching. For example, in one embodiment, prior to performing the selective wet etching, selectively dry etching the polycrystalline material may be accomplished first by exposing the polycrystalline material to a gas-phase environment. Then the wet etching techniques described herein may be performed. In this manner, a combination of dry and wet processing may be achieved, with the wet processing providing the wet ALE benefits described herein. Thus, for example, the wet etching may be utilized to reduce the surface roughness that exists after the dry etching process.

Figure 5:
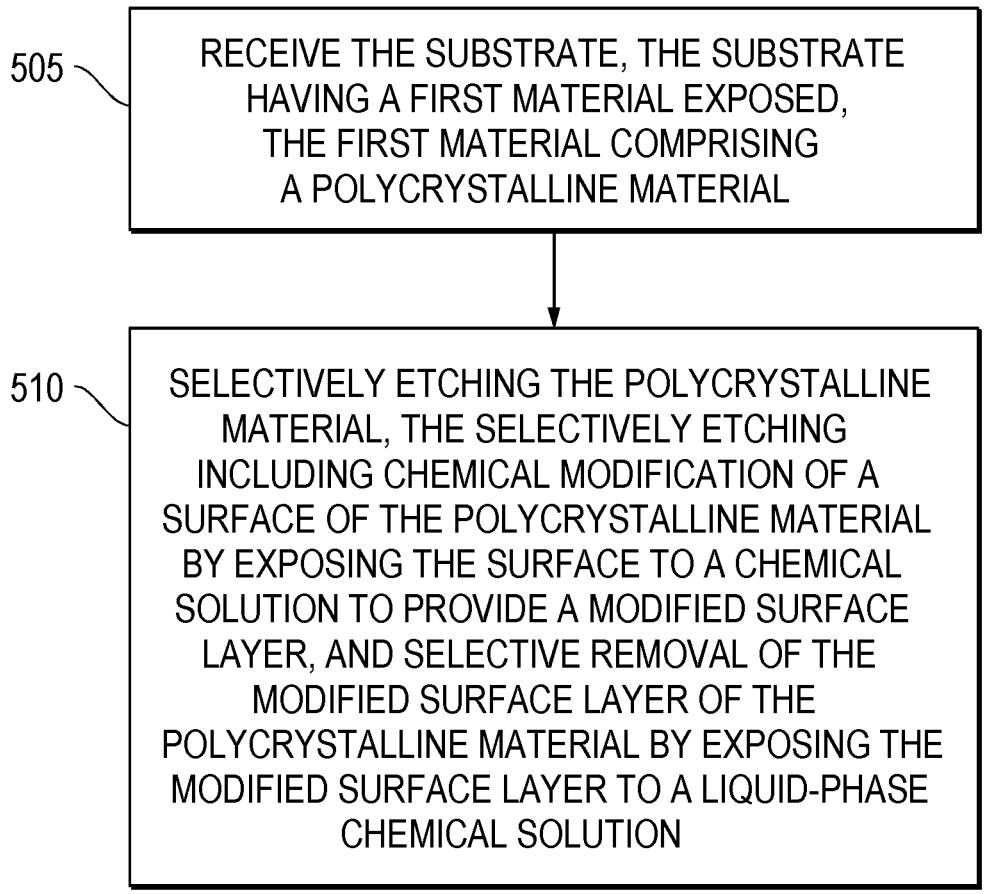
FIGS. 5 and 6 demonstrate exemplary methods for processing a substrate according to the techniques described herein.
Figure 6:
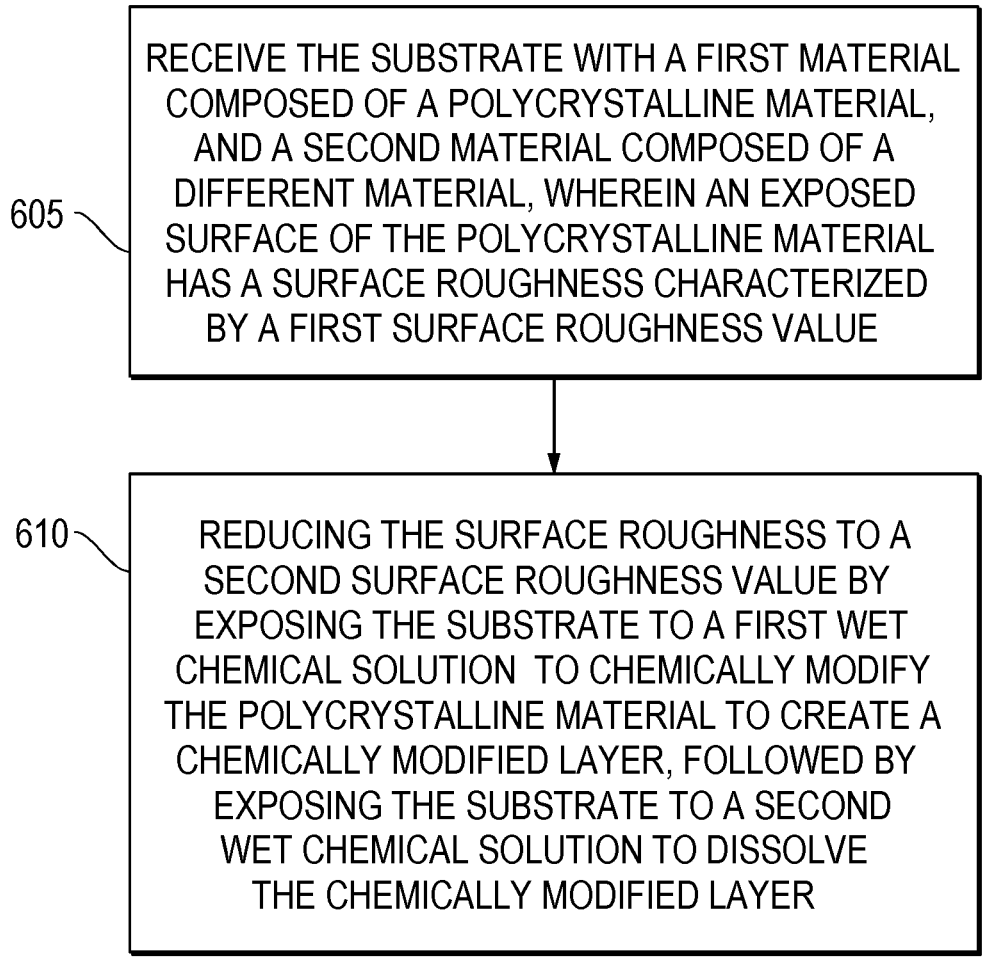

FIGS. 5-6 illustrate exemplary methods for use of the processing techniques described herein. It will be recognized that the embodiments of FIGS. 5-6 are merely exemplary and additional methods may utilize the techniques described herein. Further, additional processing steps may be added to the methods shown in the FIGS. 5-6 as the steps described are not intended to be exclusive. Moreover, the order of the steps is not limited to the order shown in the figures as different orders may occur and/or various steps may be performed in combination or at the same time.

FIG. 5 illustrates a method for etching a substrate. The method comprises step 505 of receiving the substrate, the substrate having a first material exposed, the first material comprising a polycrystalline material. Then, the method includes a step 510 of selectively etching the polycrystalline material, the selectively etching including chemical modification of a surface of the polycrystalline material by exposing the surface to a chemical solution to provide a modified surface layer, and selective removal of the modified surface layer of the polycrystalline material by exposing the modified surface layer to a liquid-phase chemical solution.

FIG. 6 illustrates a method for etching a substrate. The method comprises step 605 of receiving the substrate with a first material composed of a polycrystalline material, and a second material composed of a different material, wherein an exposed surface of the polycrystalline material has a surface roughness characterized by a first surface roughness value. The method then includes step 610 of reducing the surface roughness to a second surface roughness value by exposing the substrate to a first wet chemical solution to chemically modify the polycrystalline material to create a chemically modified layer, followed by exposing the substrate to a second wet chemical solution to dissolve the chemically modified layer.

Figure 7A:
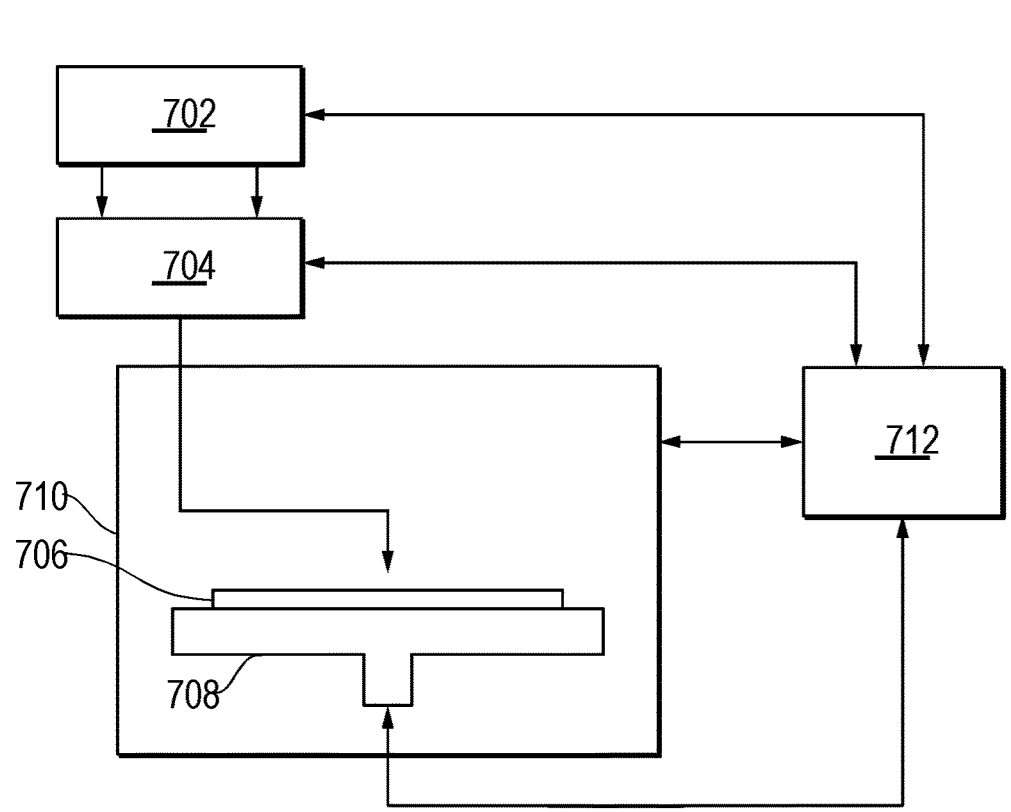
FIG. 7A illustrates an exemplary wet etch tool for performing the techniques disclosed herein.

It is further noted that the techniques described herein may be utilized with a wide range of processing systems, apparatus, and platforms. For example, the techniques may be utilized in a wet etch processing system as shown in FIG. 7A, and the wet etch processing system can be used in combination with a dry etch processing system as shown in processing platform embodiment of FIG. 7B. Other variations can also be implemented.

FIG. 7A is a block diagram of one example embodiment for a wet etch processing system 700 that can be used with respect to the disclosed techniques to etch (such as the wet ALE techniques described herein) a material on the surface of a substrate 706. The wet etch processing system 700 includes a wet process chamber 710. The wet process chamber 710 may be a pressure controlled chamber. A substrate 706 (in one example a semiconductor wafer) is held on a substrate holder 708, such as for example an electrostatic chuck. The substrate holder 708 can also be configured to rotate at a controlled speed.

A chemical supply system 702 (such as a wet chemical supply system) and a chemical injection manifold for a wet etch solution (for example a wet ALE etch as described herein) are used with the wet process chamber 710. The chemical supply system 702 can include reservoirs to hold the various liquid etch solutions and/or be connected to chemical supply line inputs. The chemical injection manifold 704 may be fluidly coupled to the wet process chamber 710. In operation, the chemical injection manifold may selectively apply desired chemicals to the wet process chamber 710, for example via a liquid delivery tube with a dispensing nozzle positioned within the wet process chamber 710. Thus, the chemical supply system 702 and the chemical injection manifold 704 can be used to dispense the liquid etch solution on the surface of the substrate 706. As described above, the wet etch performed may be a wet ALE etch such as described above. For example, the chemical supply system 702 and the chemical injection manifold 704 may be used to inject wet chemicals which may provide the first etchant and second etchants described above for the wet ALE process. In addition, the chemical supply system 702 and the chemical injection manifold 704 may be used to provide other liquids to the wet process chamber 710, such as for example, the rinse liquids and/or other solvents described above.

Components of the wet etch processing system 700 can be coupled to, and controlled by, a controller 712 that in turn can be coupled to a corresponding memory storage unit and user interface (not shown). Various processing operations can be executed via the user interface, and various processing recipes and operations can be stored in a storage unit. Accordingly, a given substrate 706 can be processed within the wet process chamber 710 with various techniques. It will be recognized that controller 712 may be coupled to various components of the wet etch processing system 700 to receive inputs from and provide outputs to the components.

The controller 712 can be implemented in a wide variety of manners. For example, the controller 712 may be a computer. In another example, the controller may include one or more programmable integrated circuits that are programmed to provide the functionality described herein. For example, one or more processors (e.g., microprocessor, microcontroller, central processing unit, etc.), programmable logic devices (e.g., complex programmable logic device (CPLD)), field programmable gate array (FPGA), etc.), and/or other programmable integrated circuits can be programmed with software or other programming instructions to implement the functionality of a proscribed plasma process recipe. It is further noted that the software or other programming instructions can be stored in one or more non-transitory computer-readable mediums (e.g., memory storage devices, flash memory, dynamic random access memory (DRAM), reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. Other variations could also be implemented.

Figure 7B:
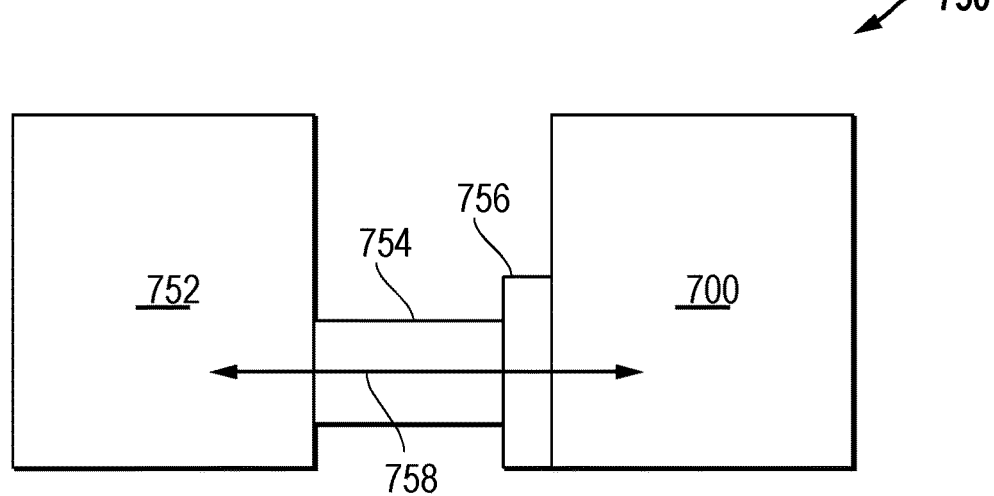
FIG. 7B illustrates an exemplary platform that includes the wet etch tool of FIG. 7A and a dry etch tool.

FIG. 7B is a block diagram of an example embodiment for a platform 750 including a wet etch processing system 700 (such as for example as described in FIG. 7A) and a dry etch processing system 752. As described herein, the wet etch processing system 700 may dispense various liquid etch solutions onto a material to perform a wet ALE process such as described above. The dry etch processing system 752 can implement any desired dry etch process that etches or removes material from a substrate being processed. For example, as discussed above, selectively dry etching a polycrystalline material may be accomplished first by exposing the polycrystalline material to a gas-phase environment of a dry etch. In operation, the dry etch processing system 752 etches a material on a substrate using dry etch chemistry.

It is noted that the dry etch processing system 752 can implement any of a wide variety of dry etch processes, such as for example, a plasma etch process, a reactive ion etch (RIE) process, a chemical vapor etch (CVE) process, an atomic layer etch (ALE) dry process, and/or other dry etch processes. Further, a dry etch process may be performed before or after a wet etch process. For example, a dry etch process can be carried out in a dry etch process chamber for the dry etch processing system 752 to remove material from the substrate resulting in a first surface roughness. The substrate is then transferred (via the transfer module 754) to the wet etch process chamber for the wet etch processing system 700 to perform the wet etch process resulting in a second surface roughness, where the second surface roughness is less than the first surface roughness. It is further noted that multiple dry etch processes and multiple wet etch processes can be performed with the substrate being transferred as needed using the transfer module 754. Other variations can also be implemented.

To facilitate processing of the substrate within the dry etch processing system 752 and the wet etch processing system 700, a transfer module 754 and an isolation pass-through module 756 can also be coupled between the two systems 700/752. The transfer module 754 is configured to move a substrate between the dry etch processing system 752 and the wet etch processing system 700 as indicated by arrow 758. The isolation pass-through module 756 is disposed between the transfer module 754 and the wet etch processing system 700 to separate the ambient environment of the transfer module 754 from the ambient environment of the wet etch processing system 700. The substrate can then be moved between the dry etch processing system 752 and the wet etch processing system 700 without exposing the substrate to potential contaminants existing outside the processing systems 700/752. This movement can also be controlled by a controller, such as the controller 712 described with respect to FIG. 7A.

Further example embodiments for a platform that can be used for the dry etch processing system 752, wet etch processing system 700, the transfer module 754, and the isolation pass-through module 756 are described in U.S. Provisional Application No. 62/794,315, filed on Jan. 18, 2019 entitled "Platform and Method for Operating for Integrated End-to-End Gate Contact Process," U.S. Provisional Application No. 62/787,607, filed on Jan. 2, 2019, entitled "Self-Aware and Correcting Heterogeneous Platform incorporating Integrated Semiconductor Processing Modules and Method for using same," U.S. Provisional Application No. 62/787,608, filed on Jan. 2, 2019, entitled "Self-Aware and Correcting Heterogeneous Platform incorporating Integrated Semiconductor Processing Modules and Method for using same," U.S. Provisional Application No. 62/788,195, filed on Jan. 4, 2019, entitled "Substrate Processing Tool with Integrated Metrology and Method of using," and U.S. patent application Ser. No. 16/356,451, filed on Mar. 18, 2019, entitled "Platform and Method of Operating for Integrated End-to-End Gat Contact Process," which published as U.S. Patent Application Publication No. 2019/0295905 on Sep. 26, 2019, the disclosures of which are all incorporated herein by reference in their entirety.

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and method of the inventions herein shown and described are to be taken as presently preferred embodiments. Equivalent techniques may be substituted for those illustrated and described herein and certain features of the inventions may be utilized independently of the use of other features, all as would be apparent to one skilled in the art after having the benefit of this description of the inventions.

What is claimed is:

1. A processing system to perform a wet etch process on a substrate, comprising:
 a wet process chamber configured to perform a wet chemical process;
 a substrate holder within the wet process chamber, and configured to support a substrate having a first material and a second material;

a chemical supply system configured to supply a first chemical solution and a second chemical solution, the second chemical solution being different than the first chemical solution;

a chemical injection manifold fluidically coupled to the wet process chamber, and configured to cyclically dispense the first chemical solution and the second chemical solution; and a controller programmably configured to perform the wet etch process to selectively remove the first material with respect to the second material by controlling a time duration for each dispense cycle of the first chemical solution and the second chemical solution, wherein the controller is configured to, in each dispense cycle:

control the chemical injection manifold to expose the substrate to the first chemical solution to chemically modify the first material to create a chemically modified layer, wherein controlling the chemical injection manifold to create the chemically modified layer comprises controlling the chemical injection manifold to dispense the first chemical solution onto a surface of the substrate, wherein the first chemical solution chemically modifies the surface of the substrate to create the chemically modified layer; and control the chemical injection manifold to remove the chemically modified layer without removing the second material, wherein controlling the chemical injection manifold to remove the chemically modified layer comprises dispensing the second chemical solution onto the chemically modified layer.

2. The processing system of claim 1, wherein the first chemical solution comprises an oxidizing agent.

3. The processing system of claim 2, wherein the first chemical solution comprises an oxygen-saturated chemical solution.

4. The processing system of claim 3, wherein the first chemical solution comprises an oxygen-saturated chemical solution that includes oxygen dissolved in water, alcohol, or acetone.

5. The processing system of claim 4, wherein the chemical supply system is further configured to supply a complexing agent.

6. The processing system of claim 5, wherein the complexing agent includes a citrate.

7. The processing system of claim 1, the chemical supply system is further arranged to supply a solvent rinse solution.

8. The processing system of claim 7, wherein the controller is programmably configured to control the chemical injection manifold to provide the solvent rinse solution following chemical modification of the surface and preceding selective removal of the chemically modified layer.

9. The processing system of claim 1, wherein the controller is programmably configured to provide the cyclical dispense of the first chemical solution and the second chemical solution partially overlapping in time.

10. The processing system of claim 1, wherein the controller is programmably configured to provide the cyclical dispense of the first chemical solution and the second chemical solution in a manner not overlapping in time.

11. The processing system of claim 1, wherein the first chemical solution includes a complexing agent, and the second chemical solution comprises water.

12. A platform for etching a substrate having polycrystalline material, comprising:

a dry etching apparatus configured to etch the polycrystalline material;

a wet etching apparatus configured to selectively etch the polycrystalline material with respect to another material on the substrate, wherein the wet etching apparatus comprises a wet process chamber, a substrate holder configured to support the substrate within the wet process chamber, a chemical supply system, a chemical injection manifold, and a controller configured to control at least the chemical injection manifold to selectively etch the polycrystalline material with respect to the another material;

wherein the wet etching apparatus is configured to supply a first chemical solution and a second chemical solution onto the substrate within the wet process chamber, the second chemical solution being different than the first chemical solution;

wherein the first chemical solution is configured to chemically modify the polycrystalline material to create a chemically modified layer; and wherein the second chemical solution is configured to remove the chemically modified layer without removing the another material;

a transfer module for moving the substrate between the dry etching apparatus and the wet etching apparatus; and an isolation pass-through module disposed between the transfer module and the wet etching apparatus to separate a transfer module environment of the transfer module from a wet etch apparatus environment of the wet etching apparatus.

13. The platform of claim 12, wherein the polycrystalline material is a transition metal.

14. The platform of claim 12, the dry etching apparatus is configured to first etch the polycrystalline material to a first surface roughness value and the wet etching apparatus is configured to subsequently etch the polycrystalline material to a second surface roughness value, second surface roughness value being less than the first surface roughness value.

15. The platform of claim 14, wherein the platform is configured to maintain the substrate in a controlled environment without exposure to ambient conditions when the substrate is transferred from the dry etching apparatus to the wet etching apparatus.

16. The platform of claim 15, wherein the first chemical solution comprises an oxidizing agent.

17. The platform of claim 16, wherein the wet etching apparatus is further arranged to supply a solvent rinse solution.

18. The platform of claim 17, wherein the wet etching apparatus is configured to provide the solvent rinse solution following chemical modification of the surface, and preceding selective removal of the chemically modified layer.

19. The platform of claim 12, wherein the platform is configured to maintain the substrate in a controlled environment without exposure to ambient conditions when the substrate is transferred from the dry etching apparatus to the wet etching apparatus.

20. The platform of claim 12, wherein the first chemical solution comprises an oxidizing agent.

21. The processing system of claim 5, wherein controlling the chemical injection manifold to create the chemically modified layer further comprises controlling the chemical injection manifold to dispense the complexing agent onto the surface of the substrate.

22. The processing system of claim 21, wherein the first chemical solution comprises the complexing agent.

\* \* \* \* \*